United States Patent
Ninomiya

(10) Patent No.: US 10,021,262 B2
(45) Date of Patent: Jul. 10, 2018

(54) IMAGE FORMING APPARATUS

(71) Applicant: KYOCERA Document Solutions Inc., Osaka (JP)

(72) Inventor: Yuichi Ninomiya, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 15/592,682

(22) Filed: May 11, 2017

(65) Prior Publication Data

US 2017/0339296 A1 Nov. 23, 2017

(30) Foreign Application Priority Data

May 19, 2016 (JP) ................. 2016-100248

(51) Int. Cl.
| | | |
|---|---|---|
| *G06F 15/00* | (2006.01) | |
| *H04N 1/00* | (2006.01) | |
| *H02S 20/30* | (2014.01) | |
| *H02S 99/00* | (2014.01) | |

(52) U.S. Cl.
CPC ......... *H04N 1/00896* (2013.01); *H02S 20/30* (2014.12); *H02S 99/00* (2013.01); *H04N 1/00411* (2013.01); *H04N 1/00559* (2013.01); *H04N 2201/0094* (2013.01)

(58) Field of Classification Search
CPC ....... H04N 2201/0094; H04N 1/00559; H04N 1/00896; H04N 1/00411; H02S 99/00; H02S 20/30
USPC ...................................... 358/1.14
See application file for complete search history.

(56) References Cited

U.S. PATENT DOCUMENTS

| | | | |
|---|---|---|---|
| 2006/0093383 A1* | 5/2006 | Buchheit ............ | G03G 21/1885 399/24 |
| 2015/0311731 A1* | 10/2015 | Tatsumoto ............ | H02J 7/0021 320/107 |
| 2016/0370684 A1* | 12/2016 | Watanabe ............... | G02F 1/163 |

FOREIGN PATENT DOCUMENTS

JP 2015-108661 A 6/2015

* cited by examiner

*Primary Examiner* — Saeid Ebrahimi Dehkordy
(74) *Attorney, Agent, or Firm* — Stein IP, LLC

(57) ABSTRACT

An image forming apparatus includes: an operation panel having an operation surface for accepting operations from a user; a photovoltaic module for generating electric power upon reception of light; and a support member for supporting the photovoltaic module in such a way that the photovoltaic module is placed above the operation surface of the operation panel. The photovoltaic module is supported so as to be pivotable relative to the support member.

10 Claims, 8 Drawing Sheets

EXTENSION DIRECTION

IMAGE FORMING APPARATUS

INCORPORATION BY REFERENCE

This application is based upon and claims the benefit of priority from the corresponding Japanese Patent Application No. 2016-100248 filed on May 19, 2016, the entire contents of which are incorporated herein by reference.

BACKGROUND

The present disclosure relates to an image forming apparatus including a photovoltaic module.

Conventionally, there has been known an image forming apparatus including a photovoltaic module. The conventional image forming apparatus, having a scanning function of reading a document set on a platen glass, includes a platen cover for pressing the document set on the platen glass. Then, the photovoltaic module is mounted on a top surface of the platen cover.

SUMMARY

In one aspect of the present disclosure, there is provided an image forming apparatus including an operation panel, a photovoltaic module, and a support member. The operation panel has an operation surface for accepting operations from a user. The photovoltaic module generates electric power upon reception of light. The support member supports the photovoltaic module in such a way that the photovoltaic module is placed above the operation surface of the operation panel. The photovoltaic module is supported so as to be pivotable relative to the support member.

DETAILED DESCRIPTION

An image forming apparatus according to one embodiment of the disclosure will be described below on a case exemplified by a multifunction peripheral.

<Overall Configuration of Multifunction Peripheral>

Figure 1:
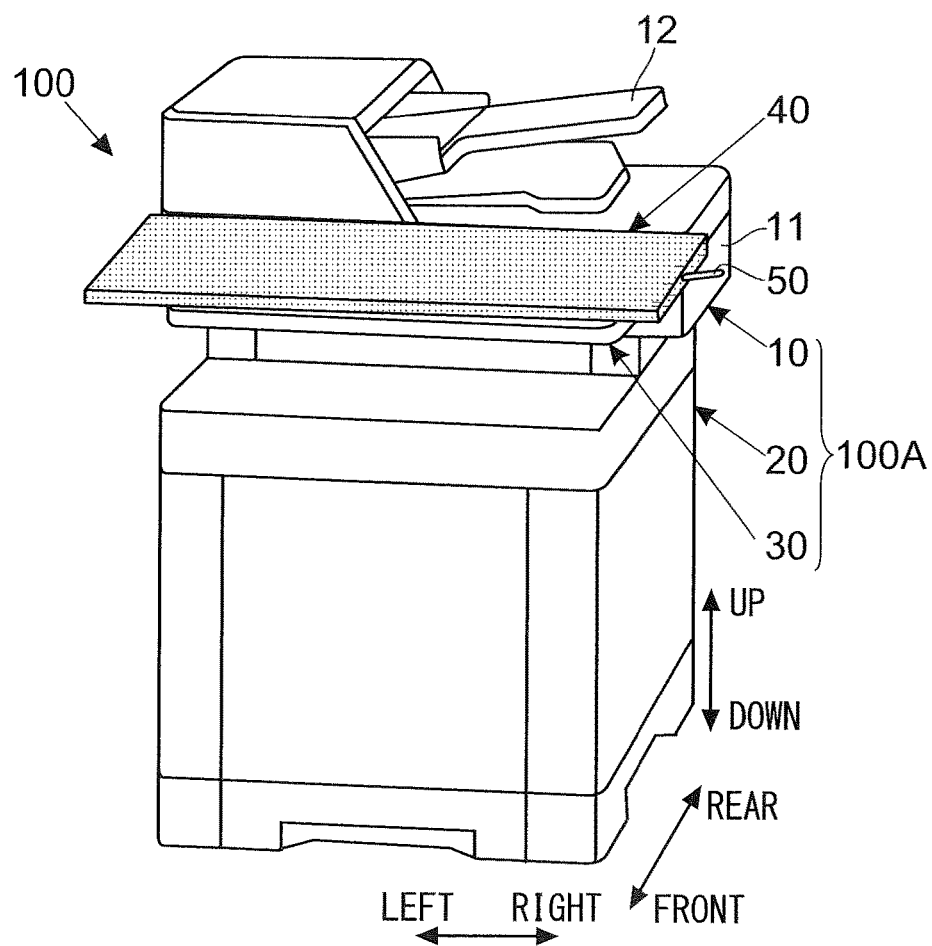
FIG. 1 is a perspective view showing an overall configuration of a multifunction peripheral according to one embodiment of the disclosure.

As shown in FIG. 1, an apparatus main body 100A of a multifunction peripheral 100 in this embodiment is made up of an image reading section 10, a printing section 20, an operation panel 30, and the like. Further, this apparatus main body 100A is equipped with a photovoltaic module 40. In FIG. 1, the photovoltaic module 40 is depicted with a dot pattern.

The image reading section 10 reads a document optically to generate image data of the document. Optical system members (not shown) of the image reading section 10 such as image sensors are placed within a housing 11 (hereinafter, referred to as reading housing 11) of the image reading section 10. The image reading section 10 also includes a document conveyance unit 12 for automatically conveying a document to a reading position. The document conveyance unit 12 is made pivotable on a pivotal shaft (not shown) serving as a fulcrum and provided at a rear face-side portion of the reading housing 11.

The printing section 20 conveys a sheet of paper set in the apparatus main body 100A to a printing position, and forms a toner image based on image data of an image to be printed (e.g., image data of a document). Then, when a sheet under conveyance passes through the printing position, the printing section 20 transfers the toner image to the sheet.

Figure 2:
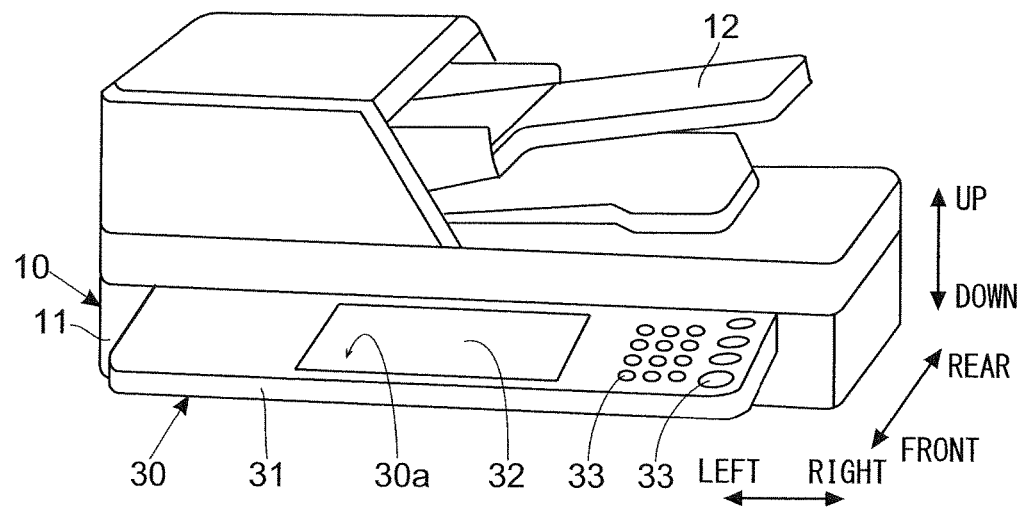
FIG. 2 is a perspective view showing a configuration of an operation panel to be mounted on the multifunction peripheral according to one embodiment of the disclosure.

The operation panel 30, as shown in FIG. 2, is so provided on a front-face side of the reading housing 11 that its operation surface 30a (facing-up surface) is inclined obliquely downward from rear to front. For example, a housing 31 that forms an outer frame of the operation panel 30 (hereinafter, referred to as panel housing 31) is fixed at a front-face side portion of the reading housing 11. In FIG. 2, the photovoltaic module 40 is omitted for convenience' sake.

A touch panel display 32 and hardware keys 33 are placed on the operation surface 30a of the operation panel 30. The touch panel display 32 and the hardware keys 33 are held inside the panel housing 31 and exposed outside via openings formed on a top surface (i.e., operation surface 30a) of the panel housing 31. It is noted that the touch panel display 32 corresponds to 'display panel.'

The touch panel display 32, which is a liquid crystal display panel with a touch panel attached as an example, displays (emits display light for) software keys for accepting various settings such as setting of job execution conditions from a user. The hardware keys 33 include a start key, ten keys, and the like.

Reverting to FIG. 1, the photovoltaic module 40 is mounted on the reading housing 11 via a support member 50. Instead, as a modification, the photovoltaic module 40 may also be mounted on the panel housing 31. In addition, the mounting structure of the photovoltaic module 40 will be described in detail later.

Figure 3:
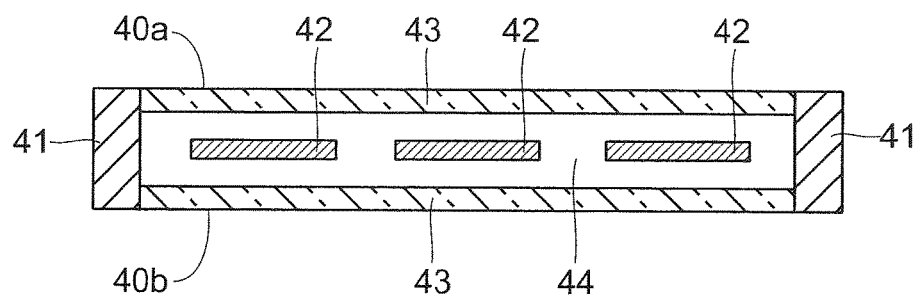
FIG. 3 is a sectional view showing a configuration of a photovoltaic module to be mounted on the multifunction peripheral according to one embodiment of the disclosure.

The photovoltaic module 40, as shown in FIG. 3, is equipped with a housing 41 (hereinafter, referred to as module housing 41). The module housing 41 is formed into a frame shape. Then, within the frame of the module housing 41 (frame body), a plurality of solar cells 42 for generating electric power upon reception of sunlight or artificial light (light of a fluorescent lamp or the like) are housed. The solar cells 42 are, for example, double-sided light reception type ones in which both sides of the top- and bottom-side surfaces function as light-receiving surfaces.

Transparent plates 43 are provided on top-surface and bottom-surface sides of the photovoltaic module 40, respectively, and the solar cells 42 are disposed between a pair of the transparent plates 43. In addition, a transparent filler material 44 is filled in areas where no solar cells 42 are disposed out of a region ranging between the pair of transparent plates 43. Then, the solar cells 42 transform light incident on outward-facing surfaces of the pair of transparent plates 43 into electric power (generates electric power upon reception of light). Hereinafter, an outer-side surface of one transparent plate 43 will be referred to as first light-receiving surface 40a and an outer-side surface of the other transparent plate 43 will be referred to as second light-receiving surface 40b.

Figure 4:
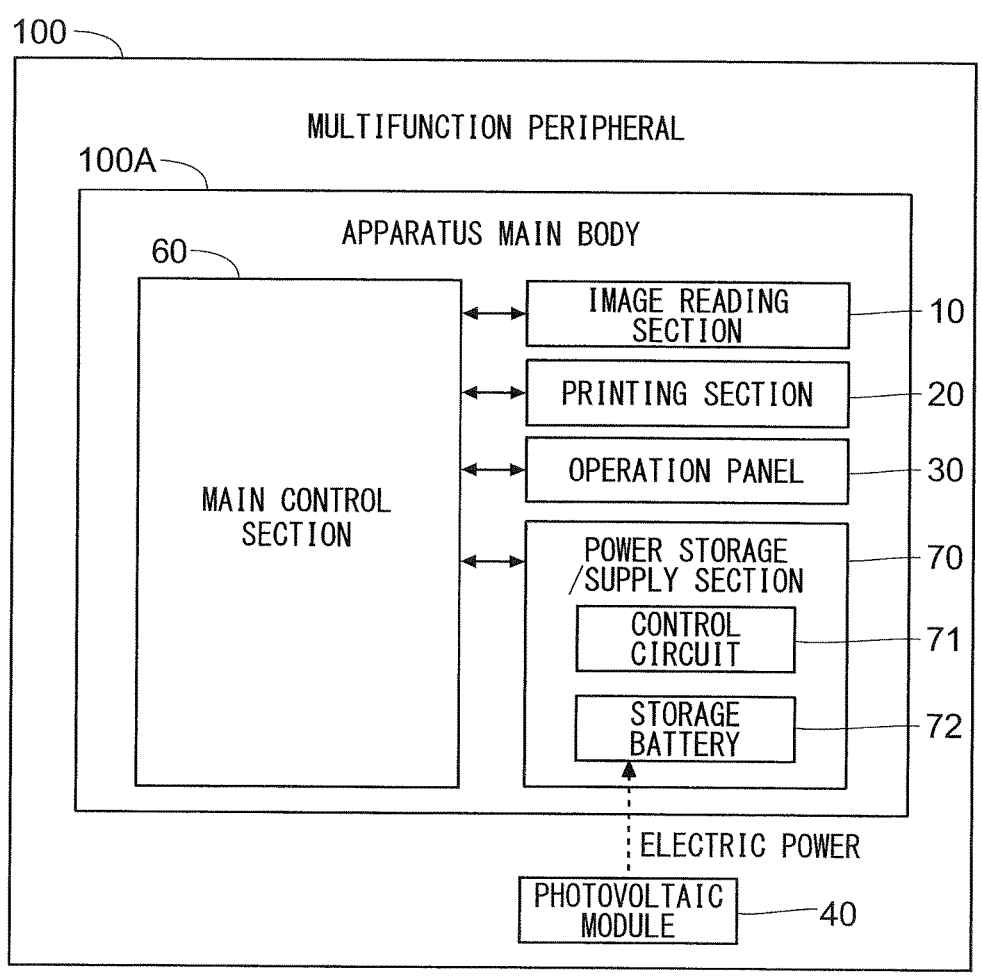
FIG. 4 is a view showing a hardware configuration of the multifunction peripheral according to one embodiment of the disclosure.

The multifunction peripheral 100, as shown in FIG. 4, also includes a main control section 60 for controlling operations of individual parts of the multifunction peripheral 100. The main control section 60 controls reading operation of the image reading section 10 and printing operation of the printing section 20. Further, the main control section 60 controls display operation of the operation panel 30 or detects operations executed for the operation panel 30.

In this case, the multifunction peripheral 100 is equipped with a power storage/supply section 70. The power storage/supply section 70 includes a control circuit 71 and a storage battery 72. The control circuit 71 controls charge and supply of electric power outputted from the photovoltaic module 40. The storage battery 72 is charged with the electric power outputted from the photovoltaic module 40.

For example, the control circuit 71 notifies the main control section 60 of a charged quantity of the storage battery 72. Upon receiving this notification, the main control section 60 decides whether or not power supply from the power storage/supply section 70 to a predetermined power-supply object part (an operation part that operates with the power supply received) is executable. When it is decided that power supply is executable, the main control section 60 instructs the control circuit 71 to execute power supply from the storage battery 72 to the predetermined power-supply object part. Although not particularly limited, electric power is supplied to circuits provided in the control section 60 and the like.

<Mounting Structure of Photovoltaic Module>

Figure 5:
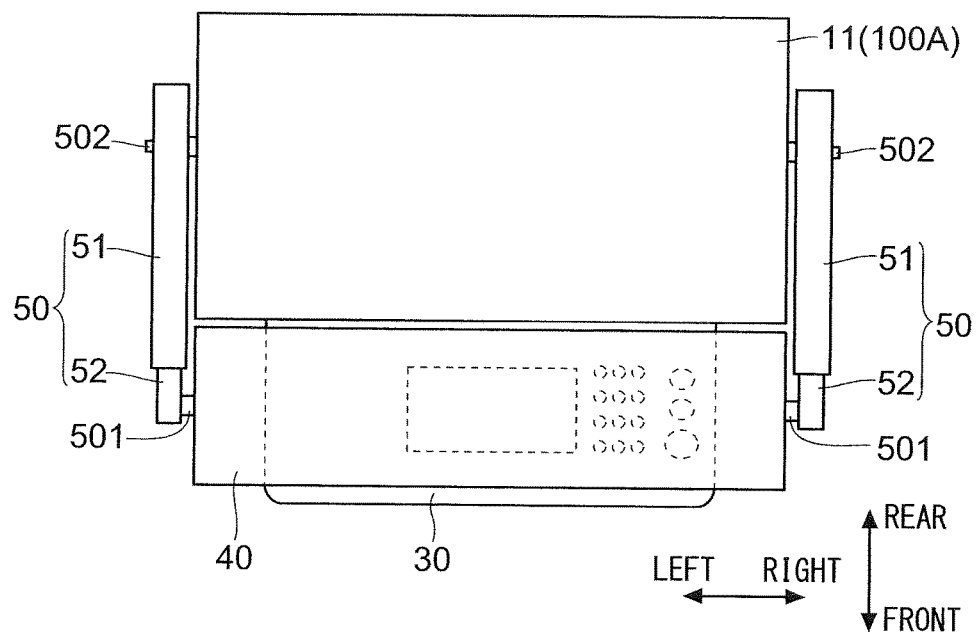
FIG. 5 is a view of the multifunction peripheral according to one embodiment of the disclosure as viewed from above.
Figure 6:
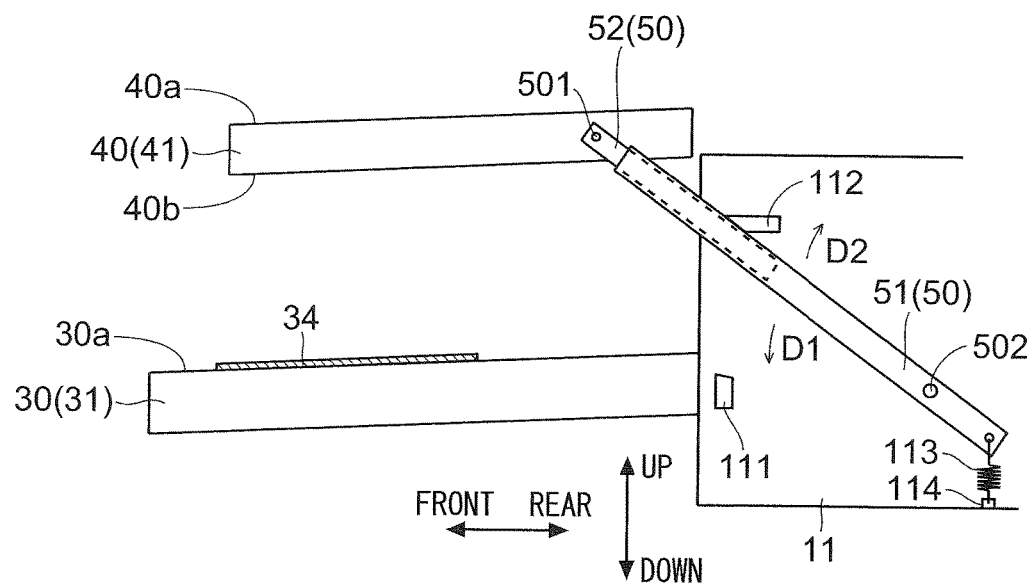
FIG. 6 is a view of a vicinity of a support member attached to the multifunction peripheral according to one embodiment of the disclosure, as viewed sideways (a view when the support member is at an upper-limit position)

As shown in FIGS. 5 and 6, the support member 50 supports the photovoltaic module 40 in such a way that the photovoltaic module 40 is placed above the operation surface 30a of the operation panel 30. More specifically, the support member 50 is formed so as to extend rectilinearly, and moreover placed on each of left- and right-side surfaces of the reading housing 11. Then, the photovoltaic module 40 is attached to one end portion of the support member 50 in its extension direction, while the other end portion of the support member 50 on the side opposite to the one-end-portion side is attached to a side face of the reading housing 11 (apparatus main body 100A).

Figure 7:
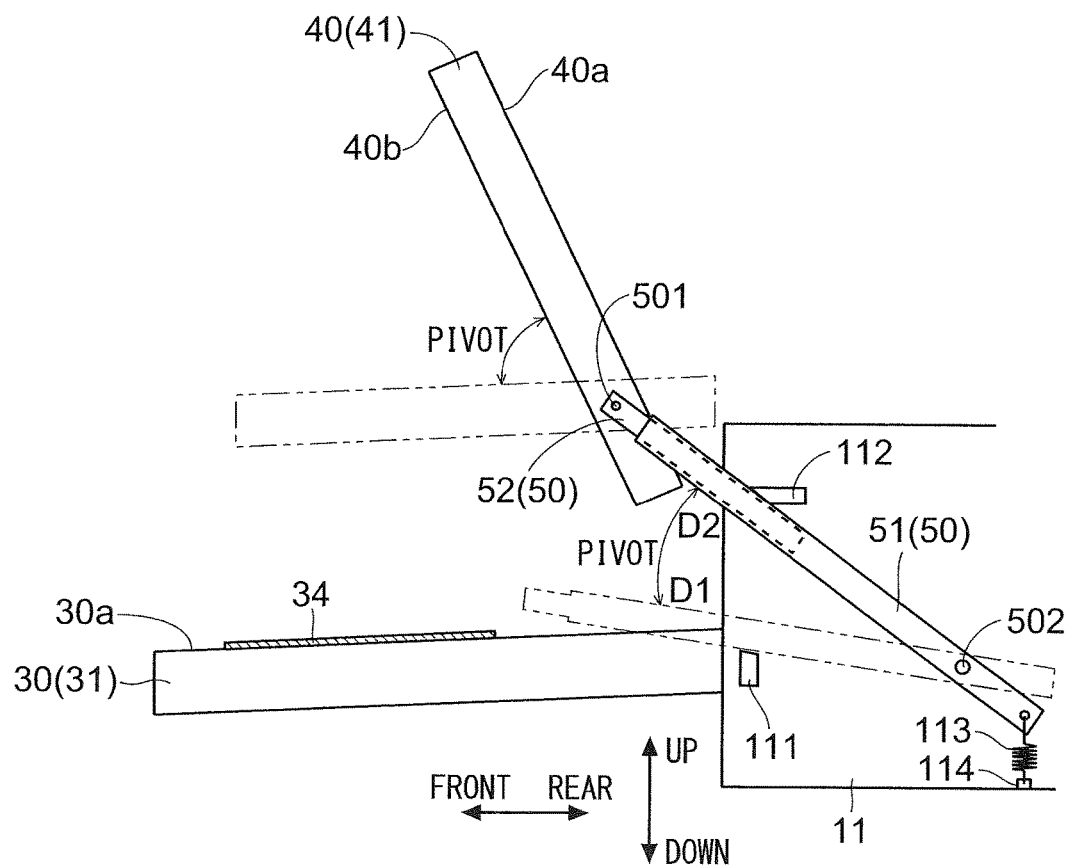
FIG. 7 is a view of a vicinity of the support member attached to the multifunction peripheral according to one embodiment of the disclosure, as viewed sideways (a view when the photovoltaic module has been pivoted upward relative to the support member)

In this connection, a pivotal shaft 501 is provided at the one end portion of the support member 50, and the module housing 41 is coupled to the pivotal shaft 501, by which the photovoltaic module 40 is attached to the support member 50. Thus, as shown in FIG. 7, the photovoltaic module 40 is pivotable relative to the support member 50 on the pivotal shaft 501 serving as a fulcrum. Although not particularly limited, a torque hinged shaft is used as the pivotal shaft 501. Therefore, the photovoltaic module 40 never pivots by its self weight (the photovoltaic module 40 can be held at an arbitrary inclination angle).

In addition, turning the photovoltaic module 40 limitlessly relative to the support member 50 would cause an electric wire 46 (see FIG. 12) extending from the photovoltaic module 40 to be twisted. For this reason, an upper surface (a surface that should face upward) and a lower surface (a surface that should face downward) of the photovoltaic module 40 are predetermined. Then, although not shown, a regulatory member for regulating a pivotal range of the photovoltaic module 40 is provided in the support member 50 so that the upper surface of the photovoltaic module 40 is prevented from facing downward (in other words, the lower surface of the photovoltaic module 40 is prevented from facing upward). Hereinafter, out of the individual surfaces of the photovoltaic module 40, the first light-receiving surface 40a will be assumed as the upper surface and the second light-receiving surface 40b will be assumed as the lower surface.

<Pivoting and Expansion/Contraction of Support Member>

Figure 8:
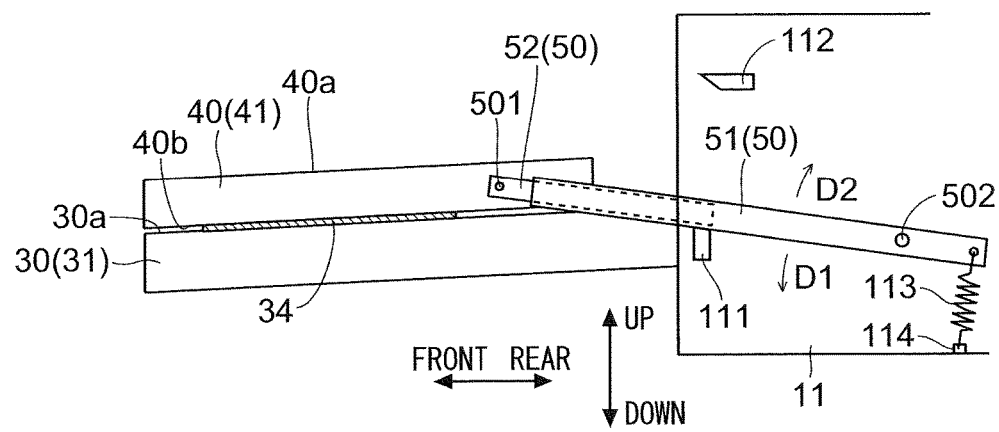
FIG. 8 is a view of a vicinity of the support member attached to the multifunction peripheral according to one embodiment of the disclosure, as viewed sideways (a view when the support member is at a lower-limit position)

As shown in FIGS. 6 to 8, a pivotal shaft 502 is provided at the other end portion of the support member 50 (an end portion on one side opposite to the side on which the photovoltaic module 40 is attached). The pivotal shaft 502 is pivotably supported by a support portion (not shown) provided on a side face of the reading housing 11. Accordingly, the support member 50 is pivoted on the pivotal shaft 502 serving as a fulcrum in a way that one end portion of the support member 50 (the end portion at which the photovoltaic module 40 is attached) is swung in an up/down direction.

As the support member 50 is pivoted, the photovoltaic module 40 attached to the support member 50 is moved in the up/down direction. When the support member 50 is pivoted in a direction D1 so that the photovoltaic module 40 is moved downward, the photovoltaic module 40 approaches the operation panel 30. On the other hand, when the support member 50 is pivoted in a direction D2 so that the photovoltaic module 40 is moved upward, the photovoltaic module 40 separates from the operation panel 30.

For example, a lower-limit stopper 111 for stopping pivotal motion of the support member 50 in the direction D1 as well as an upper-limit stopper 112 for stopping pivotal motion of the support member 50 in the direction D2 are provided on a side face of the reading housing 11. Although not particularly limited, the lower-limit stopper 111 and the upper-limit stopper 112 are formed from rubber or other elastic materials, respectively.

With the above arrangement, after the support member 50 has come into contact with the lower-limit stopper 111, the support member 50 can no longer be pivoted in the direction D1 (see FIG. 8). On the other hand, after the support member 50 has come into contact with the upper-limit stopper 112, the support member 50 can no longer be pivoted in the direction D2 (see FIGS. 6 and 7). Consequently, a position of the support member 50 resulting when the support member 50 comes to contact with the lower-limit stopper 111 serves as a lower-limit position (corresponding to 'first position'), and a position of the support member 50 resulting when the support member 50 comes to contact with the upper-limit stopper 112 serves as an upper-limit position (corresponding to 'second position'). That is, the support member 50 is pivoted between the lower-limit position and the upper-limit position.

Figure 9:
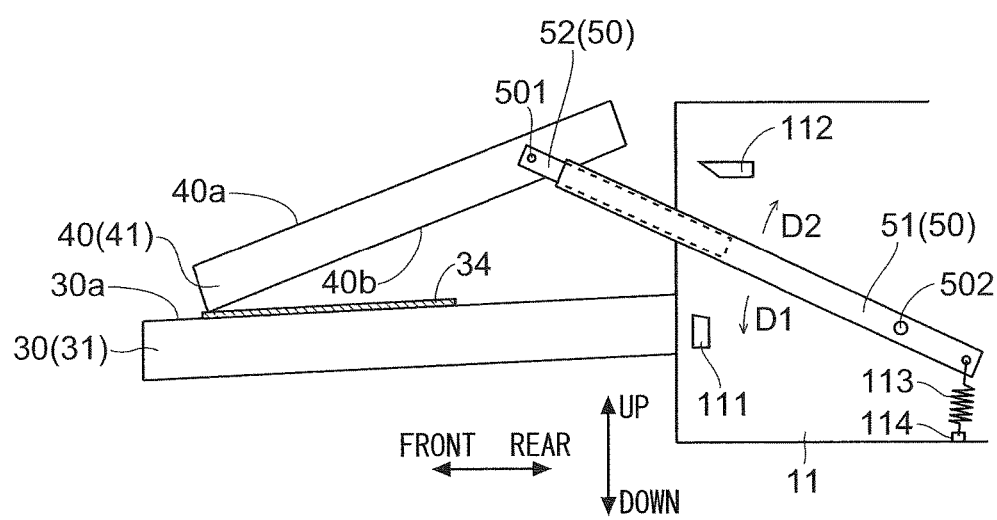
FIG. 9 is a view of a vicinity of the support member attached to the multifunction peripheral according to one embodiment of the disclosure, as viewed sideways (a view while the support member is pivoting)

As the support member 50 located at the upper-limit position is pivoted in the direction D1, the photovoltaic module 40 is moved downward, causing the photovoltaic module 40 to come into contact with the operation panel 30 as shown in FIG. 9. For example, a cushion member 34 formed from rubber or the like for relaxing shocks upon contact of the photovoltaic module 40 with the operation surface 30a of the operation panel 30 is provided on the operation surface 30a. Then, after the photovoltaic module 40 has come into contact with the cushion member 34, continuing pivoting the support member 50 in the direction D1 causes the support member 50 to reach the lower-limit position, resulting in a state shown in FIG. 8.

Then, when the support member 50 has reached the lower-limit position, the operation surface 30a of the operation panel 30 is closed (covered) by the photovoltaic module 40. In this state, the first light-receiving surface 40a (upper surface) of the photovoltaic module 40 faces toward a direction opposite to the direction in which the first light-receiving surface 40a faces the operation surface 30a of the operation panel 30. Meanwhile, the second light-receiving surface 40b (lower surface) of the photovoltaic module 40 faces the operation surface 30a of the operation panel 30.

With the photovoltaic module 40 placed at such a position as to close the operation surface 30a of the operation panel 30, since the first light-receiving surface 40a of the photovoltaic module 40 faces upward, light such as sunlight or artificial light comes incident on the first light-receiving surface 40a, so that power generation utilizing the light is fulfilled in the photovoltaic module 40. Further, in the state that the photovoltaic module 40 is placed at such a position as to close the operation surface 30a of the operation panel 30, when the operation panel 30 has executed a display action (has emitted display light), the display light of the operation panel 30 comes incident on the second light-receiving surface 40b of the photovoltaic module 40. Accordingly, the power generation utilizing the display light of the operation panel 30 is fulfilled in the photovoltaic module 40.

On the other hand, when the support member 50 is pivoted in the direction D2 so that the support member 50 has reached the upper-limit position, the resulting state is as shown in FIGS. 6 and 7. That is, while the support member 50 is at the upper-limit position, the photovoltaic module 40 makes the operation surface 30a of the operation panel 30 exposed. In this state, the photovoltaic module 40 can be pivoted arbitrarily relative to the support member 50 (see FIG. 7). Accordingly, the inclination angle of the photovoltaic module 40 can be changed arbitrarily.

In this connection, the support member 50 is normally biased by a biasing member 113 such as a tension spring so as to be pivoted from the lower-limit position toward the upper-limit position. For example, with a tension spring used as the biasing member 113, one end of the tension spring is attached to the support member 50 while the other end of the tension spring is attached to a spring post 114 protruding from the reading housing 11.

Figure 10:
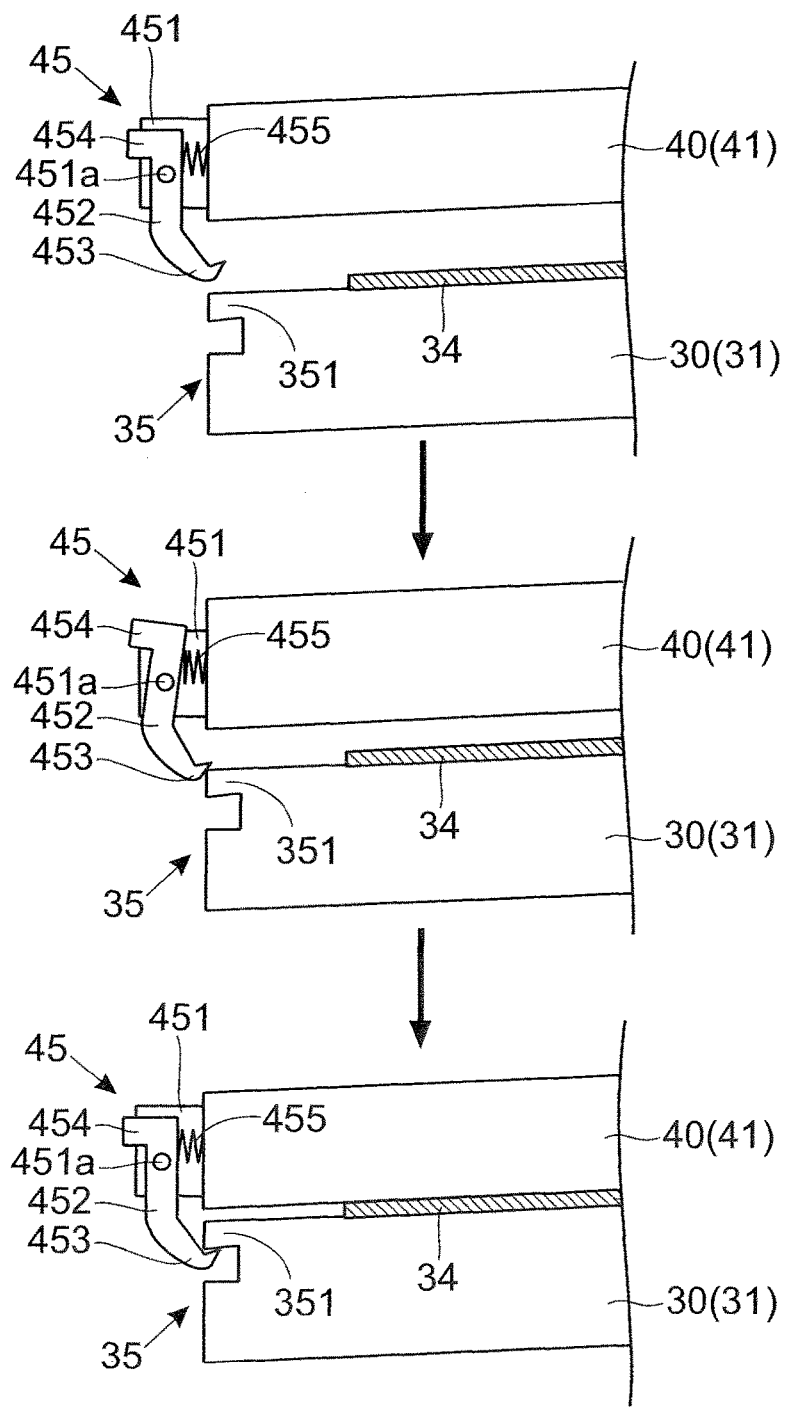
FIG. 10 is a view showing a structure of individual engaging portions in the photovoltaic module and the operation panel to be mounted on the multifunction peripheral according to one embodiment of the disclosure.

Also as shown in FIG. 10, a module-side engaging portion 45 and a panel-side engaging portion 35 are provided in the photovoltaic module 40 and the operation panel 30, respectively. It is noted that the module-side engaging portion 45 and the panel-side engaging portion 35 correspond to 'first engaging portion' and 'second engaging portion,' respectively.

The module-side engaging portion 45 includes an actuator 452 pivotably attached to a holder 451. The actuator 452 is pivotable on a pivotal shaft 451a serving as a fulcrum and provided in the holder 451. One end 453 of the actuator 452 is formed into a claw shape so as to function as an engaging piece (hereinafter, referred to as engaging piece 453). The other end 454 of the actuator 452 is biased by a biasing member 455 such as a compression spring. The panel-side engaging portion 35 includes an engaging protrusion 351 formed engageable with the engaging piece 453.

The module-side engaging portion 45 and the panel-side engaging portion 35 are engaged with each other by making the support member 50 pivoted until the support member 50 reaches the lower-limit position. This will be explained in more detail below.

First, in a state that photovoltaic module 40 is separate from the operation panel 30 (state of the uppermost view of FIG. 10), pivoting the support member 50 to move the photovoltaic module 40 downward causes the engaging piece 453 to be brought into contact with the engaging protrusion 351. In this state, continuing to move the photovoltaic module 40 further downward causes the actuator 452 to be pivoted against the biasing force of the biasing member 455. Thereafter, continuing to move the photovoltaic module 40 until the support member 50 reaches the lower-limit position causes the engaging piece 453 to enter under the engaging protrusion 351, with the result that the engaging piece 453 and the engaging protrusion 351 are engaged with each other (state of lowermost view of FIG. 10).

Thus, since the module-side engaging portion 45 and the panel-side engaging portion 35 are engaged with each other while the support member 50 is at the lower-limit position (in the state shown in FIG. 8), the support member 50 is never pivoted toward the upper-limit position by the biasing force of the biasing member 113. That is, the photovoltaic module 40 is never moved upward (the photovoltaic module 40 is held at such a position as to close the operation surface 30a of the operation panel 30).

In addition, the engagement between the module-side engaging portion 45 and the panel-side engaging portion 35 is released by pushing the other end 454 of the actuator 452 inwardly against the biasing force of the biasing member 455. With the engagement between the module-side engaging portion 45 and the panel-side engaging portion 35 released, the support member 50 is pivoted from the lower-limit position toward the upper-limit position by the biasing force of the biasing member 113.

As a result of this, while the support member 50 is at the lower-limit position, only pressing the other end 454 of the actuator 452 allows the support member 50 to be pivoted from the lower-limit position toward the upper-limit position. That is, the operation surface 30a of the operation panel 30 can be exposed (operation on the operation panel 30 is enabled). With this arrangement, a damper or the like may be used as the upper-limit stopper 112 to relax shocks upon collisions of the support member 50 against the upper-limit stopper 112.

Also, the photovoltaic module 40 is movable not only in the up/down direction but also in the extension direction of the support member 50. In other words, the support member 50 is made extendable and contractible in the extension direction.

Figure 11:
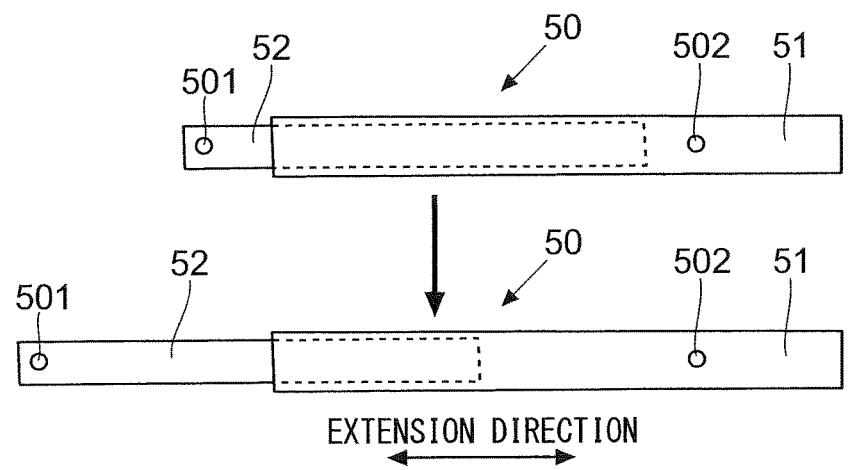
FIG. 11 is a view showing a structure of the support member attached to the multifunction peripheral according to one embodiment of the disclosure.
Figure 12:
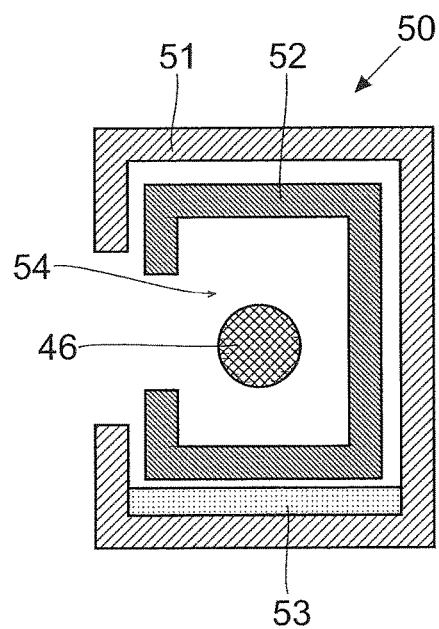
FIG. 12 is a sectional view of the support member attached to the multifunction peripheral according to one embodiment of the disclosure.

For example, as shown in FIGS. 11 and 12, the support member 50 includes a rail member 51 and a slide member 52. The rail member 51, which is to be attached to the reading housing 11, has the pivotal shaft 502 pivotally supported by the reading housing 11. The slide member 52, which is slidably supported by the rail member 51, slides relative to the rail member 51 (the support member 50 extends and contracts in the extension direction). Then, the photovoltaic module 40 is coupled to the slide member 52 via the pivotal shaft 501.

Although not particularly limited, the rail member 51 is formed into a generally tilted-U shape (partly-cut-out annular shape) in cross section. That is, the rail member 51 has a space inside. The slide member 52 is inserted inside the rail member 51. As a result, the slide member 52 is made slidable in the extension direction while being guided by an inner surface of the rail member 51. For example, an antislip friction sheet 53 made from rubber or the like is placed on an inner bottom surface of the rail member 51. The friction sheet 53, coming into contact with the slide member 52, is enabled to prevent the slide member 52 from slipping down by its self weight.

The slide member 52 is also formed into a generally tilted-U shape in cross section, like the rail member 51. Then, an inner space of the support member 50 is assigned as a housing space 54 for housing the electric wire 46 extending from the photovoltaic module 40. The electric wire 46 can be housed in the housing space 54 by inserting the electric wire 46 inside the support member 50 through a slit formed in the support member 50, as an example.

The multifunction peripheral 100 (image forming apparatus) of this embodiment, as described above, includes the operation panel 30 having the operation surface 30a for accepting operations from a user, the photovoltaic module 40 for generating electric power upon reception of light, and the support member 50 for supporting the photovoltaic module 40 in such a way that the photovoltaic module 40 is placed above the operation surface 30a of the operation panel 30. Further, the photovoltaic module 40 is supported pivotable relative to the support member 50.

With the constitution of this embodiment, pivoting the photovoltaic module 40 (adjusting the inclination of the photovoltaic module 40) relative to the support member 50 in response to a direction of light incidence makes it possible to intercept light by the photovoltaic module 40 so as to prevent light reflection by the operation surface 30a of the operation panel 30. Accordingly, since the photovoltaic module 40 serves also as a light shielding member, a disadvantageous likelihood that the operation surface 30a of the operation panel 30 becomes less easy to view due to light reflection at the operation surface 30a of the operation panel 30 can be suppressed even without providing any additional light shielding member. In particular, in a case where the multifunction peripheral 100 is installed at a near-window, sunny place with a view to increasing the quantity of power generation by the photovoltaic module 40, it would be the case that not only artificial light (light of a fluorescent lamp and the like) but also sunlight comes incident on the operation surface 30a of the operation panel 30, making the operation surface 30a of the operation panel 30 even less easy-to-view. On the other hand, with the constitution of this embodiment, by virtue of adjustment of the inclination of the photovoltaic module 40 with a view to intercepting sunlight incident on the operation surface 30a of the operation panel 30 through the window, the quantity of power generation by the photovoltaic module 40 can be increased, and moreover the occurrence that the operation surface 30a of the operation panel 30 becomes less easy to view due to sunlight reflection at the operation surface 30a of the operation panel 30 can be avoided.

In addition, placing the photovoltaic module 40 above the operation surface 30a of the operation panel 30 may cause the operation surface 30a of the operation panel 30 to be less easy to view depending on users. However, since the photovoltaic module 40 is supported pivotable relative to the support member 50, the inclination of the photovoltaic module 40 can be adjusted so that the operation surface 30a of the operation panel 30 becomes easier to view.

Also in this embodiment, as described above, as the support member 50 is pivoted toward the lower-limit position, the photovoltaic module 40 is moved so as to approach the operation surface 30a of the operation panel 30; when the support member 50 has reached the lower-limit position, the photovoltaic module 40 closes the operation surface 30a of the operation panel 30; and as the support member 50 is pivoted from the lower-limit position toward the upper-limit position, the photovoltaic module 40 is moved so as to go apart from the operation surface 30a of the operation panel 30. With this constitution, for example, while the multifunction peripheral 100 is out of use, holding the support member 50 at the lower-limit position makes the operation surface 30a of the operation panel 30 remaining closed by the photovoltaic module 40, so that deposition of dust on the operation surface 30a of the operation panel 30 can be suppressed. That is, there is no need for additionally providing an exclusive cover for suppressing deposition of dust on the operation surface 30a of the operation panel 30 (deposition of dust on the operation surface 30a of the operation panel 30 can be suppressed without increasing the parts count). In addition, operation with the operation panel 30 is enabled by pivoting the photovoltaic module 40 from the lower-limit position toward the upper-limit position so that the photovoltaic module 40 is separated from the operation surface 30a of the operation panel 30, with the operation surface 30a of the operation panel 30 exposed.

Also in this embodiment, as described above, the touch panel display 32 for emitting display light is placed on the operation surface 30a of the operation panel 30. The photovoltaic module 40 has its top surface and bottom surface both functioning as light-receiving surfaces. In this case, while the second light-receiving surface 40b of the photovoltaic module 40 is opposed to the operation surface 30a of the operation panel 30, display light emitted by the touch panel display 32 can be utilized for power generation by the photovoltaic module 40.

Also in this embodiment, as described above, the support member 50 is biased by biasing force of the biasing member 113 so as to be pivoted from the lower-limit position toward the upper-limit position. Also, the module-side engaging portion 45 is provided in the photovoltaic module 40, and moreover the panel-side engaging portion 35 engageable with the module-side engaging portion 45 is provided in the operation panel 30. Further, the module-side engaging portion 45 and the panel-side engaging portion 35 are engaged with each other while the support member 50 is at the lower-limit position. With this arrangement, while the operation surface 30a of the operation panel 30 is closed by the photovoltaic module 40, releasing the engagement between the module-side engaging portion 45 and the panel-side engaging portion 35 causes the operation panel 30 to be moved upward (the support member 50 is pivoted from the lower-limit position toward the upper-limit position), with the result that the operation surface 30a of the operation panel 30 is exposed. Thus, a transition from a state that the operation surface 30a of the operation panel 30 is closed by the photovoltaic module 40 to another state that the operation with the operation panel 30 is enabled can be achieved by a one-touch operation.

Also in this embodiment, as described above, the support member 50 includes the rail member 51, and the slide member 52 slidably supported by the rail member 51. Then, the photovoltaic module 40 is supported by the slide member 52. With this arrangement, not only the inclination of the photovoltaic module 40 but also the positional adjustment of the photovoltaic module 40 in its front/rear direction (extension direction of the support member 50) is also enabled.

Also in this embodiment, as described above, the support member 50 is so formed that the housing space 54 is ensured in its inside, and the electric wire 46 extending from the photovoltaic module 40 is housed in the housing space 54. With this arrangement, even when the photovoltaic module 40 is placed at a position separate from the apparatus main body 100A (above the operation surface 30a of the operation panel 30), a bare exposure of the electric wire 46 can be suppressed.

The embodiment disclosed herein should be construed as not being limitative but being an exemplification at all points. The scope of the disclosure is defined not by the above description of the embodiment but by the appended claims, including all changes and modifications equivalent in sense and range to the claims.

For example, a motor for pivoting the support member 50 may be provided in the multifunction peripheral 100, where the support member 50 may be pivoted (the photovoltaic module 40 may be moved in the up/down direction) by controlling drive of the motor with the main control section 60.

Also, with this constitution, for a transition of power mode of the multifunction peripheral 100 from normal mode to power-saving mode (sleep mode), the support member 50 may be pivoted to the lower-limit position so that the operation surface 30a of the operation panel 30 is closed by the photovoltaic module 40. It is noted that the term 'normal mode' refers to a mode in which normal power supply is executed for power-supply object parts of the multifunction peripheral 100, and that the term 'power-saving mode' refers to a mode in which the power supply for power-supply object parts of the multifunction peripheral 100 is limited as compared with the normal mode.

For example, the main control section 60 counts nonuse time, which is a time period that has elapsed with the multifunction peripheral 100 out of use. Then, when the nonuse time has reached a predetermined threshold time, the main control section 60 decides that the transition condition for the power-saving mode has been satisfied. In this case, the main control section 60 makes the support member 50 pivoted to the lower-limit position, executing the transition to the power-saving mode.

What is claimed is:

1. An image forming apparatus comprising:
   an operation panel having an operation surface for accepting operations from a user;
   a photovoltaic module for generating electric power upon reception of light; and
   a support member for supporting the photovoltaic module in such a way that the photovoltaic module is placed right above the operation surface of the operation panel, wherein
   the photovoltaic module is supported so as to be pivotable relative to the support member.

2. The image forming apparatus according to claim 1, wherein
   the support member includes a rail member, and a slide member slidably supported by the rail member, and
   the photovoltaic module is supported by the slide member.

3. The image forming apparatus according to claim 1, wherein
   the support member is so formed that a housing space is ensured in its inside, and an electric wire extending from the photovoltaic module is housed in the housing space.

4. The image forming apparatus according to claim 1, further comprising:
   a document conveyance unit, wherein
   the support member is away from the document conveyance unit.

5. The image forming apparatus according to claim 1, wherein
   the support member is pivotable relative to an apparatus main body.

6. An image forming apparatus comprising:
   an operation panel having an operation surface for accepting operations from a user;
   a photovoltaic module for generating electric power upon reception of light; and
   a support member for supporting the photovoltaic module in such a way that the photovoltaic module is placed above the operation surface of the operation panel, wherein
   the photovoltaic module is supported so as to be pivotable relative to the support member,
     the support member is attached to an apparatus main body so as to be pivotable between a first position and a second position, and
     the photovoltaic module is supported by the support member in such a fashion that: as the support member is pivoted toward the first position, the photovoltaic module is moved so as to approach the operation surface of the operation panel; when the support member has reached the first position, the photovoltaic module closes the operation surface of the operation panel; and as the support member is pivoted from the first position toward the second position, the photovoltaic module is moved so as to go apart from the operation surface of the operation panel.

7. The image forming apparatus according to claim 6, wherein
   a display panel for emitting display light is placed on the operation surface of the operation panel, and
   the photovoltaic module is a double-sided light reception type photovoltaic module in which both top surface and bottom surface thereof function as light-receiving surfaces.

8. The image forming apparatus according to claim 6, further comprising
   a biasing member for biasing the support member so that the support member is pivoted from the first position toward the second position, wherein
   a first engaging portion is provided in the photovoltaic module, and a second engaging portion engageable with the first engaging portion is provided in the operation panel, and while the support member is at the first position, the first engaging portion and the second engaging portion are engaged with each other.

9. The image forming apparatus according to claim 6, wherein the support member includes a rail member, and a slide member slidably supported by the rail member, and the photovoltaic module is supported by the slide member.

10. The image forming apparatus according to claim 6, wherein the support member is so formed that a housing space is ensured in its inside, and an electric wire extending from the photovoltaic module is housed in the housing space.

* * * * *